United States Patent [19]

Tsunoi et al.

[11] Patent Number: 4,779,009
[45] Date of Patent: Oct. 18, 1988

[54] MASTER-SLAVE TYPE FLIP-FLOP CIRCUIT

[75] Inventors: Hiroyuki Tsunoi, Yokohama; Eiji Sugiyama, Kawasaki; Motohiro Seto, Yokohama, all of Japan

[73] Assignee: Fujitsu Limited, Kawasaki, Japan

[21] Appl. No.: 886,828

[22] Filed: Jul. 18, 1986

[30] Foreign Application Priority Data

Jul. 18, 1985 [JP] Japan ................. 60-158584

[51] Int. Cl.⁴ ...................... H03K 3/284; H03K 19/00
[52] U.S. Cl. ................. 307/272.2; 307/480; 307/269; 307/442; 371/61
[58] Field of Search ............... 307/442, 443, 269, 480, 307/272 A, 481, 272 R; 328/206, 34; 371/61, 47, 57, 62

[56] References Cited

U.S. PATENT DOCUMENTS

| | | | |
|---|---|---|---|
| 4,441,075 | 4/1984 | McMahon | 324/73 R |
| 4,535,467 | 8/1985 | Davis et al. | 377/81 |
| 4,580,066 | 4/1986 | Berndt | 307/276 |
| 4,628,277 | 12/1986 | Berndt | 307/476 |

FOREIGN PATENT DOCUMENTS 59-106130 6/1984 Japan .

*Primary Examiner*—Stanley D. Miller
*Assistant Examiner*—Richard Roseen
*Attorney, Agent, or Firm*—Staas & Halsey

[57] ABSTRACT

In a master-slave type flip-flop circuit including a normal function in a normal mode for flip/flop operation and a scanning function in a scanning mode for testing an integrated circuit, the master-slave type flip-flop circuit comprises: a master stage having a first pair of differential transistors for taking in data, a second pair of differential transistors for latching data taken in to the first pair of differential transistors, a third pair of differential transistors for taking in scanning data, and a fourth pair of differential transistors for activating the second and third pair of differential transistors in the scanning mode; and a slave stage having a first pair of differential transistors for taking in data from the master stage, a second pair of differential transistors for latching data taken in to the first pair of differential transistors, a third pair of differential transistors for latching scanning data, and a fourth pair of differential transistors for activating the first and third pair of differential transistors in the scanning mode.

8 Claims, 5 Drawing Sheets

MASTER-SLAVE TYPE FLIP-FLOP CIRCUIT

BACKGROUND OF THE INVENTION

1. Field of the Invention

The present invention is related to a flip-flop circuit. More particularly, it is related to a master-slave type flip-flop circuit having a scanning function which is used in a post-manufacture test of an integrated circuit (IC) containing the master-slave type flip-flop circuit.

2. Description of the Related Art

The master-slave type flip-flop circuit (below; master-slave FF) is constituted by two flip-flop circuits, i.e., a master flip-flop (master stage) and a slave flip-flop (slave stage). The master stage and the slave stage circuits have a similar arrangement and are activated by the leading edge and trailing edge of clock signals. Consequently, many master-slave FF's are provided as internal circuits of an IC together with many gate circuits.

Circuits having a scanning function are used for testing the internal circuits of the IC, and each of these scanning function circuits is added to each of the master-slave FF's. Accordingly, the performance test of the IC is achieved by testing the master-slave FF through the scanning function.

Conventionally, the scanning function circuit arrangement is provided at an external portion of each master-slave FF arrangement, but this external circuit has the following problems, i.e., the circuit arrangement is complicated, power consumption is large, and the operation speed is slow.

SUMMARY OF THE INVENTION

The primary object of the present invention is to provide a master-slave type flip-flop circuit having a scanning function which is used in a test of an integrated circuit after manufacture.

Another object of the present invention is to provide a master-slave type flip-flop circuit having a scanning function and enabling a simplified circuit arrangement for testing, a reduced power consumption, and a high speed operation.

In accordance with the present invention, there is provided a master-slave type flip-flop circuit including a normal function in a normal mode for flip-flop operation and a scanning function in a scanning mode for testing an integrated circuit, comprising: a master stage having a first pair of differential transistors for taking in data, a second pair of differential transistors for latching the data taken in to the first pair of differential transistors, a third pair of differential transistors for taking in scanning data, and a fourth pair of differential transistors for activating the second and third pair of differential transistors in the scanning mode; and a slave stage having a first pair of differential transistors for taking in data from the master stage, a second pair of differential transistors for latching the data taken in to the first pair of differential transistors, a third pair of differential transistors for latching scanning data, and a fourth pair of differential transistors for activating the first and third pair of differential transistors in the scanning mode.

DESCRIPTION OF THE PREFERRED EMBODIMENTS

Before describing the preferred embodiments, an explanation will be given of a conventional master-slave type flip-flop circuit having an external circuit for a scanning function.

Figure 1:
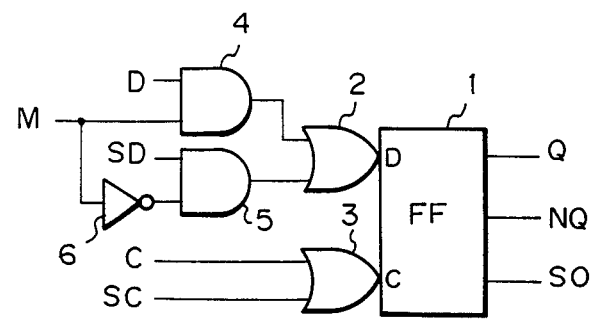
FIG. 1 is a block diagram of conventional master-slave type flip-flop circuit having an external scanning function.

Referring to FIG. 1, 1 represents a master-slave type flip-flop circuit (master-slave FF), 2 and 3 OR gates, 4 and 5 AND gates, and 6 an inverter. The circuit for a scanning function is constituted by two OR gates 2 and 3, two AND gates 4 and 5, and the inverter 6. These circuits are provided at an external portion of the master-slave FF 1. Accordingly, the master-slave FF itself does not have such a scanning function. Reference C represents a clock signal, SC a scanning clock signal, D a data signal, SD a scanning data signal, and M a mode switching signal. Signals C and D are used in the normal mode, and SC and SD are used in the scanning mode. The scanning mode is used for the test of the internal circuit of the IC. These modes are switched in correspondence with the mode switching signal M. That is, when the signal M is high (H) level, the normal mode is selected, and when the signal M is low (L) level, the scanning mode is selected. An output signal Q and an inverted output signal NQ are obtained in the normal mode and a scanning output SO is obtained in the scanning mode.

In the normal mode, the mode signal M is "H" level so that the output of the AND gate 4 is changed to the "L" or "H" level in correspondence with the "L" or "H" level of the data D. Here, the output of the inverter 6 is "L" level and the scanning data SD is set to the "H" or "L" level, and accordingly, the output of the AND gate 5 is set to the "L" level. Consequently, the output of the OR gate 2 is changed to the "H" or "L" level in correspondence with the "H" or "L" level of the data. Moreover, when the scanning clock SC is set to the "L" level, the output of the OR gate 3 is changed to the "H" or "L" level of the clock signal C.

In the scanning mode, the mode signal M is "L" level so that the output of the AND gate 4 is "L" level. Here, the output of the inverter 6 is "H" level so that the output of the AND gate 5 is changed to the "H" or "L" level in correspondence with the "H" or "L" level of the scanning data SD. Accordingly, the output of the OR gate 2 is changed to the "H" or "L" level in correspondence with the "H" or "L" level of the scanning data SD. Moreover, when the clock signal C is set to the "L" level, the output of the OR gate 3 is changed to the "H" or "L" level in correspondence with the "H" or "L" level of the scanning clock SC. The scanning data SD is output from the OR gate 2 and input to the D terminal in the master-slave FF 1. Here, the scanning clock signal SC is output from the OR gate 3 and input to the C terminal in the master-slave FF 1. Based on the scanning clock SC and the scanning data SD the scanning out SO is obtained from the master-slave FF 1 in accordance with the same operation as that for the clock signal C and the data D.

Figure 2:
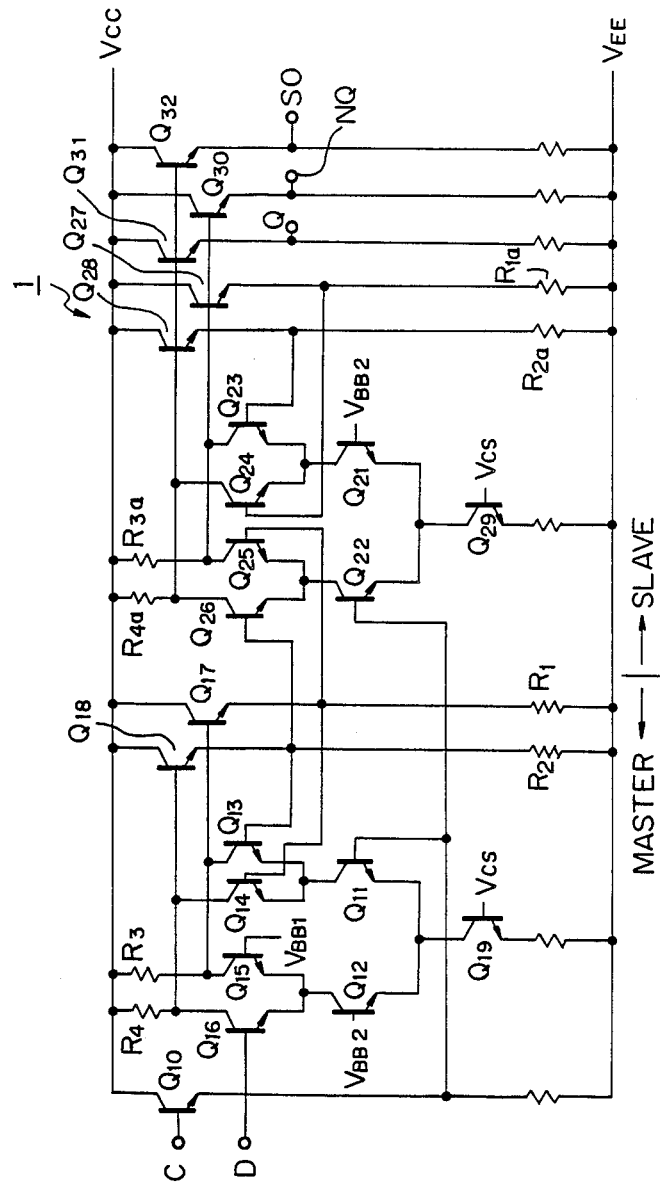
FIG. 2 is a detailed circuit diagram of the conventional master-slave type flip-flop circuit shown in FIG. 1.

Referring to FIG. 2, the master stage is shown on the left and the slave stage on the right of the figure. Accordingly, the master-slave FF is constituted by the master stage and the slave-stage. These stages are also constituted by a plurality of emitter-coupled differential circuits. That is, pairs of transistors $Q_{11}$ and $Q_{12}$, $Q_{13}$ and $Q_{14}$, $Q_{15}$ and $Q_{16}$, $Q_{21}$ and $Q_{22}$, $Q_{23}$ and $Q_{24}$, and $Q_{25}$ and $Q_{26}$ constitute the differential circuits. $V_{BB1}$ and $V_{BB2}$ denote reference voltages, each of which is set to an intermediate value between the earth potential $V_{CC}$ and the power source voltage $V_{EE}$. The transistors $Q_{19}$ and $Q_{29}$ are used as a source obtained by the constant current voltage $V_{CS}$.

The operation of this circuit arrangement will be explained with reference to FIG. 3.

In the normal mode, when the clock signal C is "H" level, the base potential of the transistor $Q_{11}$ becomes "H" level and the transistor $Q_{11}$ is turned ON, since this base potential is higher than the reference voltage $V_{BB2}$ applied to the base of the transistor $Q_{12}$. In this step, the transistor $Q_{12}$ is turned OFF. Accordingly, a pair of differential transistors $Q_{13}$ and $Q_{14}$ is activated and a pair of differential transistors $Q_{15}$ and $Q_{16}$ is not activated. The transistors $Q_{13}$ and $Q_{14}$ function as a latch circuit for latching outputs of the transistors $Q_{15}$ and $Q_{16}$ when the transistor $Q_{11}$ is turned ON. In this case, the output of the master stage is latched and the data of the master stage is held (stored) in the previous state regardless of the "H" or "L" level of input data D.

When the clock signal C is "L" level, the transistor $Q_{11}$ is turned OFF and the transistor $Q_{12}$ is turned ON. Accordingly, a pair of transistors $Q_{15}$ and $Q_{16}$ is activated and the data is taken in to the transistor $Q_{16}$. When the data potential is higher than the reference potential $V_{BB1}$, the transistor $Q_{16}$ is turned ON and the transistor $Q_{15}$ is turned OFF. The transistors $Q_{17}$ and $Q_{18}$ constitute an emitter-follower output circuit. When the transistor $Q_{16}$ is turned ON and the transistor $Q_{15}$ is turned OFF, the transistor $Q_{17}$ outputs an "H" level signal and the transistor $Q_{18}$ outputs an "L" level signal. When the transistor $Q_{15}$ is turned ON and the transistor $Q_{16}$ is turned OFF, the transistor $Q_{17}$ outputs an "L" level signal and the transistor $Q_{18}$ outputs an "H" level signal. As explained above, these states are latched to the transistors $Q_{13}$ and $Q_{14}$ when the clock is "H" level. These output states are transmitted to the transistors $Q_{25}$ and $Q_{26}$ in the slave stage.

The slave stage has the same circuit arrangement as that of the master stage. That is, a pair of differential transistors $Q_{25}$ and $Q_{26}$ corresponds to a pair of transistors $Q_{15}$ and $Q_{16}$, a pair of differential transistors $Q_{23}$ and $Q_{24}$ corresponds to a pair of transistors $Q_{13}$ and $Q_{14}$, a pair of differential transistors $Q_{21}$ and $Q_{22}$ corresponds to a pair of transistors $Q_{11}$ and $Q_{12}$, and a pair of emitter-follower transistors $Q_{27}$ and $Q_{28}$ corresponds to a pair of differential transistors $Q_{17}$ and $Q_{18}$. Moreover, output emitter-follower transistors $Q_{30}$, $Q_{31}$ and $Q_{32}$ output the inverted data NQ, the data Q, and the scanning output data SO.

When the clock signal C is "L" level, the transistor $Q_{22}$ is turned OFF and the transistor $Q_{21}$ is turned ON. Accordingly, the transistors $Q_{23}$ and $Q_{24}$ are activated and the transistors $Q_{25}$ and $Q_{26}$ are not activated. In this state, the transistors $Q_{23}$ and $Q_{24}$ function as a latch circuit for latching outputs of the transistors $Q_{25}$ and $Q_{26}$. The data of the slave FF is held in the previous state. When the clock signal C is "H" level, the transistor $Q_{22}$ is turned ON. Accordingly, either the transistor $Q_{25}$ or transistor $Q_{26}$ is turned ON in response to the output of the transistor $Q_{17}$ or transistor $Q_{18}$. The "H" level and "L" level signals are output from each collector of the transistors $Q_{25}$ and $Q_{26}$.

Figure 3:
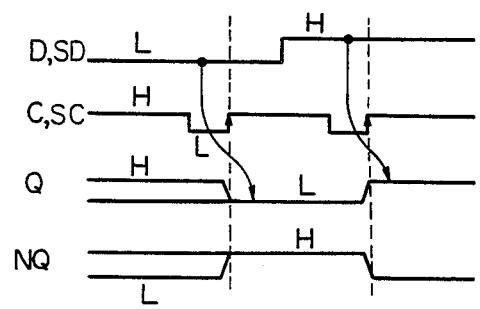
FIG. 3 is a timing chart for explaining each signal in the normal mode in the circuit shown in FIG. 2.

As shown in FIG. 3, these output signals Q and NQ are taken out from each emitter of the transistors $Q_{31}$ and $Q_{30}$. Accordingly, as explained above, in this master-slave FF, when the clock signal C is "L" level, the data is taken in to the master stage and the output is latched in the slave stage. On the contrary, when the clock signal C is "H" level, the output is latched in the master stage and the latched data is transmitted to the slave stage and the data output from the emitters of the transistors Q and NQ. These flip/flop operations are repeated in correspondence with the "H" and "L" level of the clock signal.

There are, however, some problems in the above-explained conventional circuit arrangement. That is, it is necessary to provide external circuits, i.e., two AND gates, two OR gates, and an inverter, to obtain the scanning function. These circuits are provided at the master-slave FF as additional external circuits. Accordingly, because of these external circuits, the circuit arrangement becomes complicated, power consumption becomes large, and the operation speed becomes slow, because the signal must pass through many stages to be input to the master-slave FF.

A master-slave type flip-flop circuit having a normal function in a normal mode and a scanning function in a scanning mode will be explained in detail hereinafter.

Figure 4:
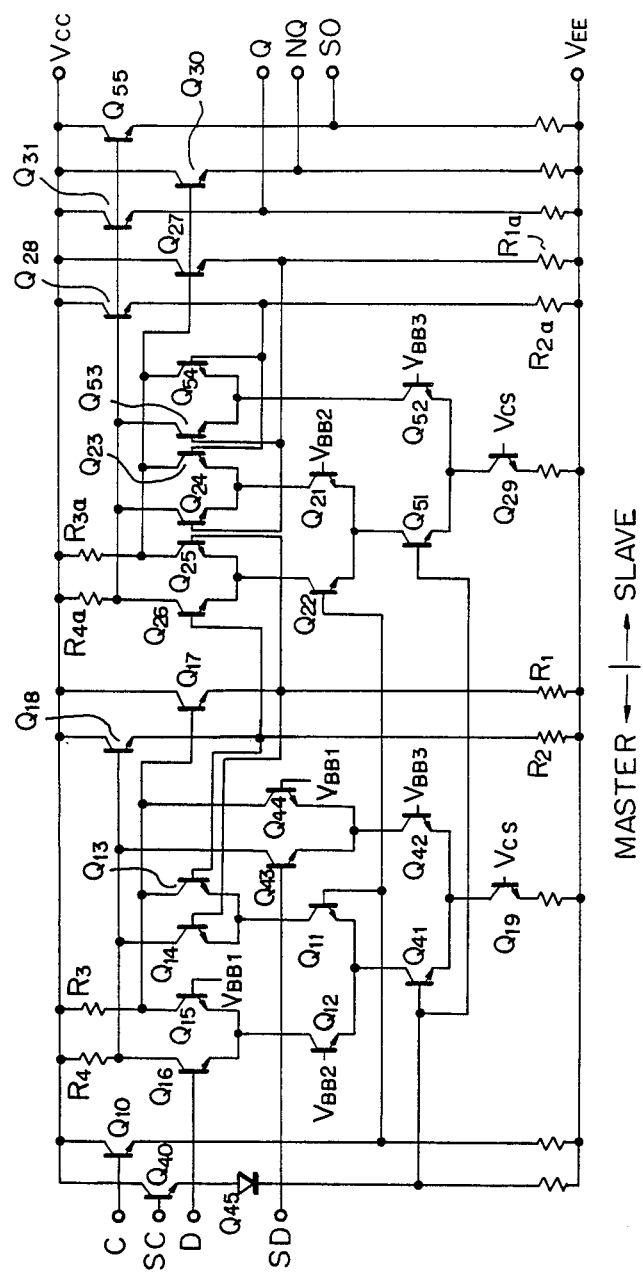
FIG. 4 is a detailed circuit diagram of a master-slave type flip-flop circuit according to an embodiment of the present invention.

Referring to FIG. 4, the same reference numbers as shown in FIG. 2 are attached to the same circuit elements. In this embodiment, transistors $Q_{40}$ to $Q_{44}$ and a diode $Q_{45}$ are added to the master stage, and transistors $Q_{51}$ to $Q_{55}$ are added to the slave stage. $V_{BB3}$ represents a reference voltage. In the master stage, a pair of transistors $Q_{43}$ and $Q_{44}$ corresponds to a pair of transistors $Q_{15}$ and $Q_{16}$. These transistors $Q_{43}$ and $Q_{44}$ are used for taking in the scanning data SD. A pair of transistors $Q_{13}$ and $Q_{14}$ is used for latching the data and is used in common between a pair of transistors $Q_{43}$, $Q_{44}$ and a pair of transistors $Q_{15}$, $Q_{16}$, i.e., in common to the normal mode and the scanning mode.

In the slave stage, a pair of transistors $Q_{53}$ and $Q_{54}$ corresponds to a pair of transistors $Q_{23}$ and $Q_{24}$. These transistors $Q_{53}$ and $Q_{54}$ are used for latching in the scanning mode. A pair of transistors $Q_{25}$ and $Q_{26}$ is used for taking in the data and is used in common between a pair of transistors $Q_{53}$, $Q_{54}$ and a pair of transistors $Q_{23}$, $Q_{24}$, i.e., in common to the normal mode and scanning mode. $R_3$, $R_4$, $R_{3a}$, and $R_{4a}$ are collector resistors as load resistors, and $R_1$, $R_2$, $R_{1a}$ and $R_{2a}$ are load resistors of the emitter follower. Each of voltages in this embodiment is applied, for example, as follows. The earth potential $V_{CC}$ is zero volt, the reference voltage $V_{BB1}$ is minus 1.3 (V), $V_{BB2}$ minus 2.1 (V), $V_{BB3}$ minus 2.9 (V), the constant current source voltage $V_{CS}$ is minus 4.0 (V), and the power source voltage $V_{EE}$ is minus 5.2 (V).

As is obvious from the above explanations, the transistors $Q_{40}$ to $Q_{44}$ and the diode $Q_{45}$ in the master stage and the transistors $Q_{51}$ to $Q_{55}$ in the slave stage are provided as a scanning function. Accordingly, it is not necessary to provide the external scanning function circuits 1 to 6 shown in FIG. 1. Moreover, it is not necessary to provide the mode switching signal M.

Figure 5:
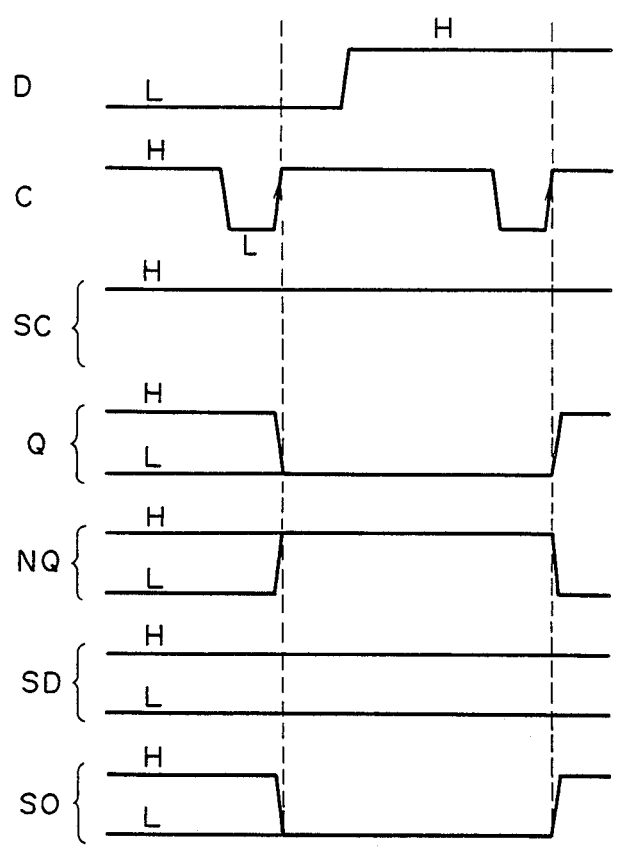
FIG. 5 is a timing chart for explaining each signal in the normal mode in the circuit shown in FIG. 4; and, FIG. 6 is a timing chart for explaining each signal in the scanning mode in the circuit shown in FIG. 4.
Figure 6:
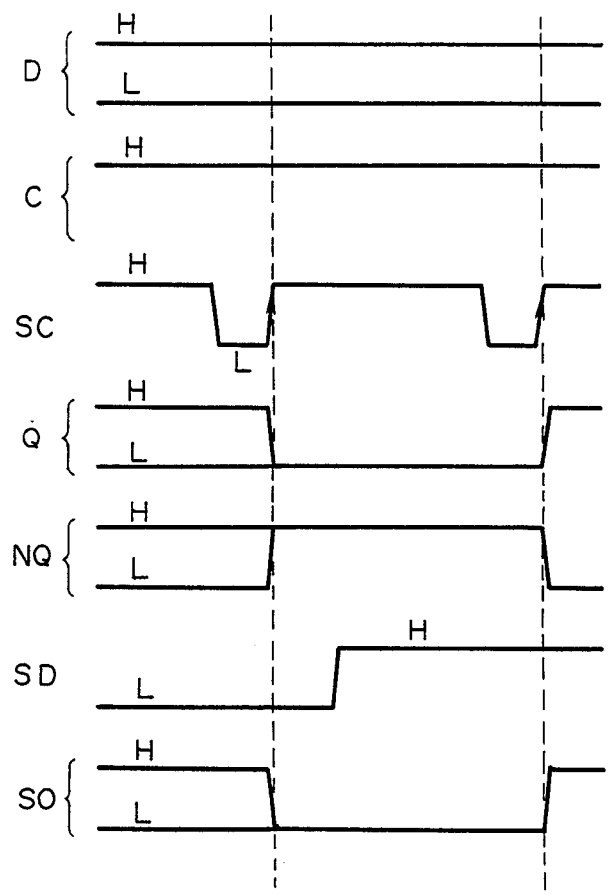

The operation of this circuit will be explained in detail with reference to FIGS. 5 and 6.

The master-slave FF is activated by "L" levels of the clock signal C in the normal mode, and by the scanning clock signal SC in the scanning mode, and is operated at the leading edge (indicated by an arrow) from the "L" level to "H" level. These clock signals C and SC are "H" level during a non-operation. That is, as shown in FIGS. 5 and 6, the states are shown in which the scanning signal SC is "H" level in the normal mode and the clock signal C is "H" level in the scanning mode.

Accordingly, in the normal mode, the scanning clock SC is "H" level, and thus the transistor $Q_{41}$ is turned ON and the transistor $Q_{42}$ is turned OFF. Accordingly, the transistors $Q_{43}$ and $Q_{44}$ are not activated. Also, the transistor $Q_{51}$ is turned ON and the transistor $Q_{52}$ is turned OFF, so that the transistors $Q_{53}$ and $Q_{54}$ are not activated. Consequently, in this state, this master-slave FF is operated in the normal mode.

In the scanning mode, the clock signal C is "H" level. When the scanning clock signal SC is "L" level, the transistor $Q_{42}$ is turned ON and the transistors $Q_{43}$ and $Q_{44}$ are activated. Accordingly, the scanning data SD is taken in the transistor $Q_{43}$. When the scanning data SD is the "H" level, the transistor $Q_{43}$ is turned ON, and when SD is "L" level, the transistor $Q_{44}$ is turned ON. In the slave side, the transistor $Q_{52}$ is turned ON and the transistors $Q_{53}$ and $Q_{54}$ are activated. Accordingly, the output scanning data is latched by these transistors $Q_{53}$ and $Q_{54}$.

When the scanning clock signal is "H" level, the transistor $Q_{41}$ is turned ON so that the transistors $Q_{13}$ and $Q_{14}$ are activated. Accordingly, the output of the transistors $Q_{43}$ and $Q_{44}$ is latched to the transistors $Q_{13}$ and $Q_{14}$ through the output emitter follower transistors $Q_{17}$ and $Q_{18}$. In the slave stage, the transistor $Q_{51}$ is turned ON and the transistors $Q_{25}$ and $Q_{26}$ are activated. Accordingly, the output of the transistors $Q_{43}$ and $Q_{44}$ is taken in to the transistors $Q_{25}$ and $Q_{26}$ through the output emitter follower transistors $Q_{17}$ and $Q_{18}$. This data is output from an output of the transistor $Q_{55}$ as the scanning output SO. As explained above, this data is latched to the transistors $Q_{53}$ and $Q_{54}$ through the emitter follower transistors $Q_{27}$ and $Q_{28}$ when the scanning clock SC is "L" level. Briefly, when the scanning clock SC is "L" level, the scanning data SD is taken in to the master stage and the output is latched in the slave mode. When the scanning clock SC is "H" level, the output is latched in the master stage, and the scanning data SD is taken in to the slave stage and is output from the slave stage.

In this master-slave FF, three pairs of differential transistors are provided in the form of three steps, for example, a first step having a pair of transistors $Q_{41}$ and $Q_{42}$, second step having a pair of transistors $Q_{11}$ and $Q_{12}$, and third step having a pair of transistors $Q_{15}$ and $Q_{16}$. In this case, the earth potential $V_{CC}=0$ (V) and the power source voltage $V_{EE}=-5.2$ (V) are sufficient to operate these transistors. Moreover, although the power consumption of these transistors is decided by the current values of the constant current sources $Q_{19}$ and $Q_{29}$, no problems arise because only the power consumption in the scanning function is added. As is obvious from this circuit arrangement, since external scanning function circuits as shown in FIG. 1 are not provided and only four pairs of transistors are added for the scanning function in the master-slave FF, it is possible to increase the operation speed in comparison with the conventional circuit shown in FIG. 1.

We claim:

1. A master-slave type flip-flop circuit, functioning in a normal mode triggered by a normal mode clock signal for flip-flop operation and in a scanning mode triggered by a scanning clock signal for testing an integrated circuit containing the master-slave type flip-flop circuit, comprising:

a master stage having first differential transistor means for receiving normal data, second differential transistor means for latching the received normal data, third differential transistor means for receiving scanning data, and fourth differential transistor means controlled by the scanning clock signal and the normal mode clock signal for activating the second and third differential transistor means in the scanning mode and activating the second and first differential transistor means in the normal mode; and a slave stage having fifth differential transistor means for receiving data from the master stage, sixth differential transistor means for latching the data received by the fifth differential transistor means in the normal mode seventh differential transistor means for latching data received by the fifth differential transistor means in the scanning mode, and eigth differential transistor means, controlled by the scanning clock signal and the normal mode clock signal for activating the fifth and seventh differential transistor means in the scanning mode and activating fifth and sixth differential means in the normal mode.

2. A master-slave type flip-flop circuit as claimed in claim 1, wherein said second differential transistor means is used in both the normal mode and the scanning mode for latching data.

3. A master-slave type flip-flop circuit as claimed in claim 1, wherein said fifth differential transistor means is used in both the normal mode and the scanning mode for receiving in data.

4. A master-slave type flip-flop circuit as claimed in claim 1, wherein said clock signal clocks the master-slave type flip-flop for the normal mode and said scanning clock signal is held to a high level in the normal mode.

5. A master-slave type flip-flop circuit as claimed in claim 1, wherein said scanning clock signal clocks the master-slave type flip-flop for the scanning mode and said clock signal is held to a high level in the scanning mode.

6. A master-slave type flip-flop circuit, functioning in a normal mode for flip-flop operation and in a scanning mode for testing an integrated circuit containing the master-slave type flip-flop circuit, comprising:

a first clock input terminal receiving a first clock signal for the normal mode, a second clock input terminal receiving a second clock signal for the scanning mode;

a master stage having first differential transistor means for receiving data in the normal mode, second differential transistor means for receiving scanning data in the scanning mode, third differential transistor means for latching said first differential transistor means, storing data received by the first differential transistor means in the normal mode, and for latching said second differential transistor means, storing data received by the second differential transistor means in the scanning mode, fourth differential transistor means, activated by the first clock signal, for latching said first differential transistor means, transferring data from the first differential transistor means to the third differential transistor means, and fifth differential transistor means, activated by the second clock signal, for latching said second differential transistor means, transferring data from the second differential transistor means to the third differential transistor means; and a slave stage having sixth differential transistor means for receiving data stored by the third differential transistor means in the normal and scanning modes, seventh differential transistor means for latching said sixth differential transistor means, storing data received by the sixth differential transistor means in the normal mode, an eighth differential transistor means for latching said sixth differential transistor means, storing data received by the sixth differential transistor means in the scanning mode, ninth differential transistor means, activated by the first clock signal, for latching said sixth differential transistor means, transferring data from the sixth differential transistor means to the seventh differential transistor means, and a tenth differential transistor means, activated by the second clock signal, for latching said sixth differential transistor means, transferring data from the sixth differential transistor means to the eighth differential transistor means.

7. An integrated circuit including first and second clock input terminals receiving clock signals from a clock signal generator, comprising:

a master stage, comprising:
first differential transistor means receiving and storing data in the first mode;
second differential transistor means receiving and storing scanning data in the second mode;
third differential transistor means latching said first and second differential transistor means and receiving and storing data from said first and second pairs of differential transistor means;
fourth differential transistor means, activated by the first clock signal, latching said first differential transistor means; and
fifth differential transistor means, activated by the second clock signal, latching said second differential transistor means; and a slave stage coupled to said master stage, said master stage and said slave stage operating cooperatively in a first mode as a flip flop circuit, and operating cooperatively in a second mode as a scanning circuit, testing the integrated circuit.

8. An integrated circuit as recited in claim 7, said slave stage comprising:

sixth differential transistor means receiving data stored by the third differential transistor means;
seventh differential transistor means latching said sixth differential transistor means and storing data received by the sixth differential transistor means in the first mode;
eighth differential transistor means latching said sixth differential transistor means and storing data received by the sixth differential transistor means in the second mode;
ninth differential transistor means, activated by the first clock signal, latching said sixth differential transistor means and transferring data from the sixth differential transistor means to the seventh differential transistor means; and
tenth differential transistor means, activated by the second clock signal, latching said sixth differential transistor means and transferring data from the sixth differential transistor means to the eighth differential transistor means.

* * * * *

UNITED STATES PATENT AND TRADEMARK OFFICE
CERTIFICATE OF CORRECTION

PATENT NO. : 4,779,009

DATED : October 18, 1988

INVENTOR(S) : Tsunoi et al.

It is certified that error appears in the above-identified patent and that said Letters Patent is hereby corrected as shown below:

Col. 3, line 19, after "a" insert --constant current--;
line 19, delete "constant";
line 20, delete "current".

Col. 6, line 27, after "mode" insert --,--;
line 30, "eigth" should be --eighth--;
line 32, after "signal" insert --,--;
line 34, after "differential" insert --transistor--.

Signed and Sealed this

Fourteenth Day of March, 1989

Attest:

DONALD J. QUIGG

Attesting Officer

Commissioner of Patents and Trademarks